(12) United States Patent
Gautam et al.

(10) Patent No.: US 11,699,634 B2
(45) Date of Patent: Jul. 11, 2023

(54) WATER COOLED PLATE FOR HEAT MANAGEMENT IN POWER AMPLIFIERS

(71) Applicant: APPLIED MATERIALS, INC., Santa Clara, CA (US)

(72) Inventors: Ribhu Gautam, Bengaluru (IN); Ananthkrishna Jupudi, Singapore (SG); Vinodh Ramachandran, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 179 days.

(21) Appl. No.: 16/460,979

(22) Filed: Jul. 2, 2019

(65) Prior Publication Data
US 2020/0350230 A1    Nov. 5, 2020

Related U.S. Application Data

(60) Provisional application No. 62/843,299, filed on May 3, 2019.

(51) Int. Cl.
| | |
|---|---|
| *H01L 23/473* | (2006.01) |
| *F28F 3/12* | (2006.01) |
| *H01L 23/36* | (2006.01) |
| *H01L 23/367* | (2006.01) |
| *H01L 23/46* | (2006.01) |

(52) U.S. Cl.
CPC .............. *H01L 23/473* (2013.01); *F28F 3/12* (2013.01); *H01L 23/36* (2013.01); *H01L 23/367* (2013.01); *H01L 23/46* (2013.01); *F28F 2210/10* (2013.01)

(58) Field of Classification Search
CPC ....... H01L 23/473–4735; H01L 23/367; H01L 23/427; H01L 23/46; H01L 23/467

USPC ........... 257/714, E23.088, E23.097, E23.098
See application file for complete search history.

(56) References Cited

U.S. PATENT DOCUMENTS

| | | | | |
|---|---|---|---|---|
| 4,268,850 A | * | 5/1981 | Lazarek | ................ H01L 23/473 |
| | | | | 174/16.3 |
| 5,703,536 A | | 12/1997 | Davis et al. | |
| 5,999,404 A | * | 12/1999 | Hileman | ............. H01L 23/4735 |
| | | | | 361/689 |
| 6,230,791 B1 | | 5/2001 | Van Dine et al. | |
| 6,388,317 B1 | | 5/2002 | Reese | |

(Continued)

FOREIGN PATENT DOCUMENTS

| | | |
|---|---|---|
| EP | 3336471 A1 | 6/2018 |
| JP | S56-161396 U | 12/1981 |

(Continued)

OTHER PUBLICATIONS

Search Report for PCT/US2020/030103, dated Aug. 13, 2020.

*Primary Examiner* — David Chen
(74) *Attorney, Agent, or Firm* — Moser Taboada

(57) ABSTRACT

Methods and apparatus for a cooling plate for solid state power amplifiers are provided herein. In some embodiments, a cooling plate of a solid state power amplifier includes a body having a rectangular shape, a first sidewall opposite a second sidewall, and a third sidewall opposite a fourth sidewall; a plurality of holes disposed on a first side of the body configured to mount a plurality of heat generating microelectronic components; and a channel having a plurality of segments disposed within the body and extending from a first port disposed on the first sidewall to a second port disposed on the first sidewall.

18 Claims, 2 Drawing Sheets

(56) References Cited

U.S. PATENT DOCUMENTS

| | | |
|---|---|---|
| 9,793,865 B2 | 10/2017 | Blair et al. |
| 2003/0032382 A1* | 2/2003 | Suzuki ............... B24D 7/10 |
| | | 451/450 |
| 2006/0227827 A1* | 10/2006 | Kawanishi ......... H01S 5/02423 |
| | | 372/36 |
| 2007/0023275 A1 | 2/2007 | Tanase et al. |
| 2009/0241575 A1* | 10/2009 | Jadric ............... H05K 7/20936 |
| | | 62/259.1 |
| 2010/0078155 A1* | 4/2010 | Morra ................. F28D 9/0068 |
| | | 165/104.32 |
| 2010/0206537 A1* | 8/2010 | Ikeda ................ H01L 23/3735 |
| | | 165/185 |
| 2010/0321889 A1* | 12/2010 | Yoshino ............ H05K 7/20927 |
| | | 361/702 |
| 2012/0138281 A1* | 6/2012 | Santini .................. B21D 53/02 |
| | | 165/170 |
| 2012/0152498 A1* | 6/2012 | Lyon ...................... F28F 3/048 |
| | | 165/104.19 |
| 2012/0175250 A1 | 7/2012 | Tanase et al. |
| 2013/0146273 A1* | 6/2013 | Chester ............. H05K 7/20281 |
| | | 361/699 |
| 2013/0215573 A1* | 8/2013 | Wagner ............. G06Q 30/0629 |
| | | 361/702 |
| 2013/0313405 A1* | 11/2013 | Asai .................... B29C 33/3814 |
| | | 249/175 |
| 2015/0369532 A1* | 12/2015 | Taguchi ............. G05D 23/1917 |
| | | 62/190 |
| 2016/0183409 A1* | 6/2016 | Zhou .................. H01L 23/4735 |
| | | 361/699 |
| 2016/0187295 A1* | 6/2016 | Kobayashi ........ B01L 3/502761 |
| | | 438/49 |
| 2016/0216048 A1* | 7/2016 | Tsai .................. H05K 7/20509 |
| 2016/0266336 A1* | 9/2016 | Oki ...................... G02B 6/4257 |
| 2018/0337109 A1 | 11/2018 | Mao et al. |
| 2019/0077275 A1* | 3/2019 | Capati ..................... B60L 58/26 |
| 2020/0053916 A1* | 2/2020 | Bonnin ............. H05K 7/20781 |
| 2020/0176356 A1 | 6/2020 | Nakagawa |

FOREIGN PATENT DOCUMENTS

| | | |
|---|---|---|
| JP | S64-26894 U | 2/1989 |
| JP | 5817552 B2 | 11/2015 |

\* cited by examiner

WATER COOLED PLATE FOR HEAT MANAGEMENT IN POWER AMPLIFIERS

CROSS-REFERENCE TO RELATED APPLICATIONS

This application claims benefit of U.S. provisional patent application Ser. No. 62/843,299, filed May 3, 2019 which is herein incorporated by reference in its entirety.

FIELD

Embodiments of the present disclosure generally relate to a cooling plate for power amplifiers.

BACKGROUND

Power amplifiers such as solid state power amplifiers (SSPAs) provide power amplification for microwave and radio frequency (RF) applications. SSPAs include heat generating microelectronic components. Forced air convection is typically used to cool SSPAs. However, for higher power (>200 W) compact sized SSPAs, forced air convection has limitations for high heat dissipation.

Thus, the inventors have provided improved methods and apparatus for cooling SSPAs.

SUMMARY

Methods and apparatus for a cooling plate for solid state power amplifiers are provided herein. In some embodiments, a cooling plate of a solid state power amplifier includes a body having a rectangular shape, a first sidewall opposite a second sidewall, and a third sidewall opposite a fourth sidewall; a plurality of holes disposed on a first side of the body configured to mount a plurality of heat generating microelectronic components; and a channel having a plurality of segments disposed within the body and extending from a first port disposed on the first sidewall to a second port disposed on the first sidewall.

In some embodiments, a solid state power amplifier includes a cooling plate having a first side configured to mount a plurality of heat generating microelectronic components and a channel disposed within the cooling plate and extending from an inlet to an outlet, wherein the inlet and the outlet are disposed on a first sidewall of the cooling plate, wherein the channel is configured to circulate a coolant, and wherein the cooling plate has a thickness of about 15.0 mm to about 45.0 mm.

In some embodiments, a method of cooling a solid state power amplifier includes drilling sidewalls of a cooling plate to create a channel within the cooling plate extending from an inlet to an outlet, wherein the cooling plate has a first side configured to mount a plurality of heat generating microelectronic components, and wherein the channel is configured to circulate a liquid coolant; and flowing a liquid coolant from a coolant source through the channel.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate typical embodiments of the disclosure and are therefore not to be considered limiting of scope, for the disclosure may admit to other equally effective embodiments.

Figure 1:
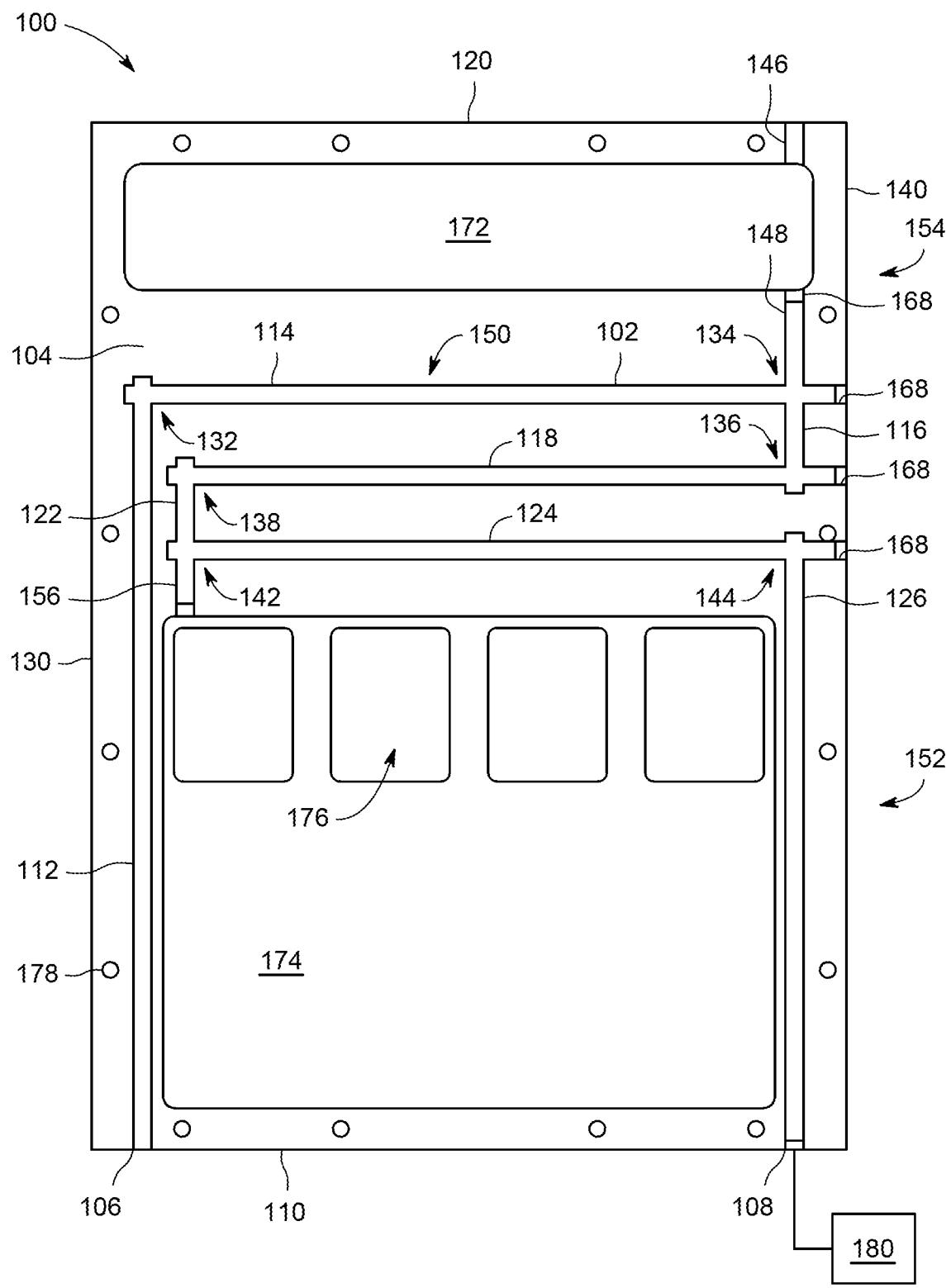
FIG. 1 is a schematic top view of a cooling plate according to some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for a cooling plate for a solid state power amplifier (SSPA) are provided herein. The SSPA includes a plurality of heat generating microelectronic components. In some embodiments, the plurality of heat generating microelectronic components are configured to provide microwave output greater than 800 watts from a microwave input of about 0.03 watts at a microwave frequency range of about 5.0 to 7.0 gigahertz. In some embodiments, the plurality of heat generating microelectronic components include field-effect transistors (FETs). In the methods and apparatus provided herein, the cooling plate includes a channel configured to flow coolant therein to cool the SSPA. In some embodiments, the channel is configured according to the layout of the plurality of heat generating microelectronic components. The cooling plate advantageously has a compact design. The cooling plate advantageously has a cost efficient design as the channel is made by drilling and connecting holes in a body of the cold plate and not using expensive welding options. The channel can advantageously be subsequently plugged at locations that do not correspond with an inlet or an outlet to seal the channel.

FIG. 1 is a schematic top view of a cooling plate according to some embodiments of the present disclosure. The cooling plate includes a body 100 having shape suitable for mounting a plurality of heat generating microelectronic components on a first side 104 of the body 100. In some embodiments, the body 100 has a rectangular shape. In some embodiments, the body 100 has a thickness of about 15.0 mm to about 45.0 mm. In some embodiments, the body is formed of a material with good thermal conductivity. In some embodiments, the body has a thermal conductivity of about 150 W/m-K or higher. In some embodiments, the body comprises aluminum (Al), copper (Cu), or silver (Ag).

The body 100, as shown in FIG. 1, includes a first sidewall 110 opposite a second sidewall 120 and a third sidewall opposite 130 a fourth sidewall 140. In some embodiments, the body 100 has a width, as defined by a distance from the third sidewall 130 to the fourth sidewall 140, of about 350.0 mm to about 500.0 mm. In some embodiments, the width is suitable for mounting the SSPA on a 19.0 inch rack. In some embodiments, the body 100 has a length, as defined by a distance from the first sidewall 110 to the second sidewall 120, of about 300.0 mm to about 700.0 mm. In some embodiments, the length is about 500.0 mm to about 700.0 mm. The body 100 includes a first portion 152 proximate the first sidewall 110 and a second portion 154 proximate the second sidewall 120. Although shown as rectangular in FIG. 1, the cooling plate can have a body 100 having other geometric configurations.

In some embodiments, the first portion 152 includes a recess 174 configured to accommodate components of the SSPA. In some embodiments, the first portion 152 includes one or more cutouts 176 extending through the body 100 configured to accommodate components of the SSPA. In some embodiments, the second portion 154 includes a recess 172 configured to accommodate components of the SSPA. In some embodiments, the body 100 includes a plurality of openings 178 proximate a peripheral edge of first side 104 of the body 100 configured to facilitate the coupling of the body 100 to other components of the SSPA.

The body 100 includes a channel 102 having a plurality of segments 150 disposed within the body 100. The channel 102 is coupled to a coolant source 180. In operation, a liquid coolant disposed in the coolant source 180 is flowed through the body 100 to cool the SSPA. In some embodiments, the flow rate of the coolant through the body 100 is calculated based on the inlet coolant temperature. In some embodiments, the liquid coolant is water. In some embodiments, the liquid coolant comprises deionized water, ethylene glycol $(CH_2OH)_2$, a mixture of water and ethylene glycol $(CH_2OH)_2$, or any other suitable coolant. In some embodiments, the liquid coolant has a temperature of about 5.0 to about 25.0 degrees Celsius. In some embodiments, the liquid coolant is flowed through the body 100 at a rate of about 3.0 liters to about 12.0 liters per minute. In some embodiments, the liquid coolant is flowed through the body 100 at a rate of about 6.0 liters to about 8.0 liters per minute.

In some embodiments, the channel 102 extends from a first port 106 disposed on the first sidewall 110 to a second port 108 disposed on the first sidewall 110. In some embodiments, the first port 106 is proximate the third sidewall 130. In some embodiments, the second port 108 is proximate the fourth sidewall 140. In some embodiments, the first port 106 corresponds with an outlet and the second port 108 corresponds with an inlet. In some embodiments, the first port 106 corresponds with an inlet and the second port 108 corresponds with an outlet. In some embodiments, the channel 102 has a circular cross section having a diameter of about 4.0 mm to about 15.0 mm.

The plurality of segments 150 of the channel 102 includes a first segment 112 extending from the first port 106 towards the second sidewall 120 to a first junction 132. In some embodiments, the first segment 112 is disposed proximate the third sidewall 130. The plurality of segments 150 includes a second segment 114 extending from the first junction 132 towards the fourth sidewall 140 to a second junction 134. In some embodiments, the plurality of segments 150 includes a third segment 116 extending from the second junction 134 to the second port 108. In some embodiments, the plurality of segments 150 includes a third segment 116 extending from the second junction 134 to a third junction 136, a fourth segment 118 extending from the third junction 136 towards the third sidewall 130 to a fourth junction 138, a fifth segment 122 extending from the fourth junction 138 towards the first sidewall 110 to a fifth junction 142, a sixth segment 124 extending from the fifth junction 142 towards the fourth sidewall 140 to a sixth junction 144, and a seventh segment 126 extending from the sixth junction 144 to the second port 108. The plurality of segments 150 are advantageously positioned to provide more cooling at areas corresponding to a higher density of heat generating microelectronic components.

In some embodiments, the second segment 114, the fourth segment 118, and the sixth segment 124 are substantially parallel to each other. In some embodiments, at least two of the first segment 112, the third segment 116, the fifth segment 122, and the seventh segment 126 are substantially parallel to each other. In some embodiments, adjacent segments of the plurality of segments 150 that extend parallel to each other are configured to flow the coolant in opposite directions. Flowing the coolant in opposite directions advantageously provides more cooling in those regions. For example, the second segment 114 is configured to flow a coolant in a direction opposite the flow of coolant in the fourth segment 118.

Figure 2:
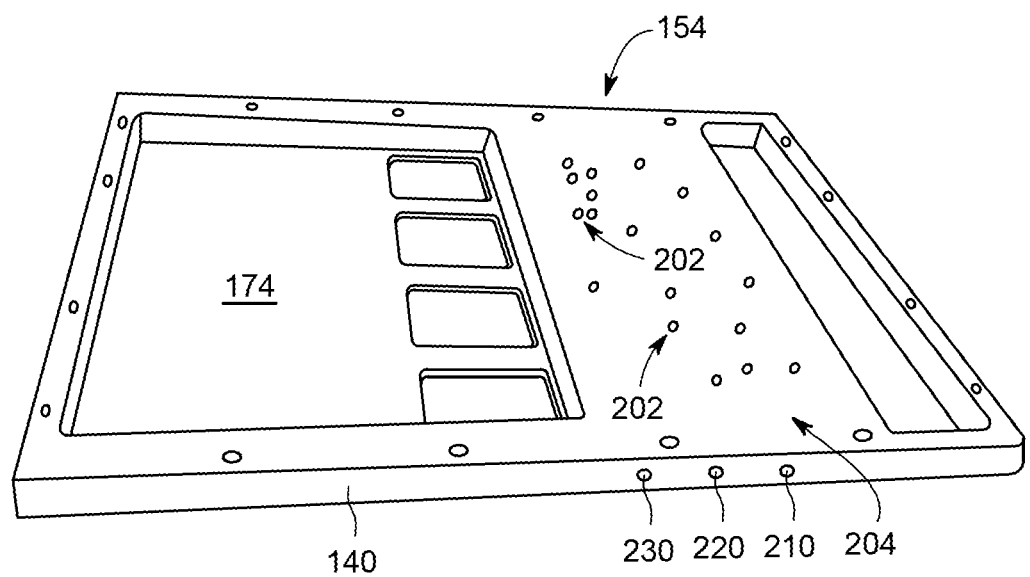
FIG. 2 is a perspective view of the cooling plate of FIG. 1 along one side of the cooling plate.
Figure 3:
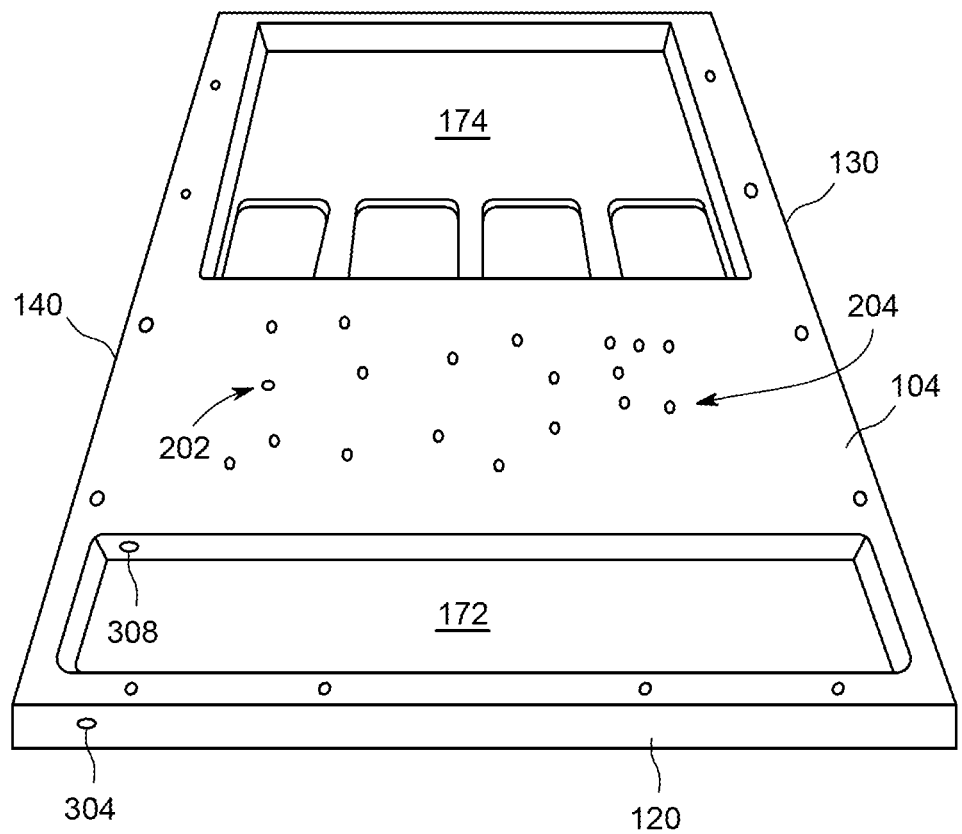
FIG. 3 is a perspective view of the cooling plate of FIG. 1 along a different side of the cooling plate.

FIGS. 2 and 3 are perspective views of the cooling plate of FIG. 1. In some embodiments, the second portion 154 includes a mounting region 204 having threaded holes 202 configured to mount the plurality of heat generating microelectronic components. The plurality of segments 150 correspond with the mounting region 204. In some embodiments, the second segment 114 extends past the second junction 134 to a first opening 210 in the fourth sidewall 140. In some embodiments, the fourth segment 118 extends past the third junction 136 to a second opening 220 in the fourth sidewall 140. In some embodiments, the sixth segment 124 extends past the sixth junction 144 to a third opening 230 in the fourth sidewall 140. In some embodiments, a plug 168 is disposed in each of the second segment 114, the fourth segment 118, and the sixth segment 124 adjacent the fourth sidewall 140 to seal the channel 102.

In some embodiments, the plurality of segments 150 includes a first guide channel 148 extending from an opening 304 of the second sidewall 120 to the second junction 134 or the third junction 136. In some embodiments, the first guide channel 148 includes an upper portion 146 separated from the rest of the first guide channel 148 by the recess 172. In embodiments having the recess 172, the first guide channel 148 includes an opening 308 on a sidewall of the recess 172 aligned with the opening 304 of the second sidewall 120. In some embodiments, a plug 168 is disposed in the first guide channel 148 adjacent the opening 308 to seal the channel 102.

In some embodiments, the plurality of segments 150 includes a second guide channel 156 extending from the fourth junction 138 to the recess 174. In some embodiments, the second guide channel 156 includes a plug 168 adjacent the recess 174 to seal the channel 102. In some embodiments, the channel 102 is created by drilling the sidewalls of the body 100. In some embodiments, the body 100 is drilled to create the first guide channel 148 and the second guide channel 156 prior to drilling the body 100 to create the second segment 114, the fourth segment 118, the fifth segment 122, and the sixth segment 124. The channel 102 can subsequently be plugged at locations adjacent any sidewalls or recesses that do not correspond with the inlet or the outlet.

While the foregoing is directed to embodiments of the present disclosure, other and further embodiments of the disclosure may be devised without departing from the basic scope thereof.

The invention claimed is:

1. A cooling plate of a solid state power amplifier, comprising:
   a body having a rectangular shape including a first sidewall opposite a second sidewall and a third sidewall opposite a fourth sidewall, wherein the body includes a recess proximate the first sidewall that includes cutouts extending entirely through the body to accommodate components of the solid state power amplifier;

a plurality of holes disposed on a first side of the body configured to mount a plurality of heat generating microelectronic components; and a channel having a plurality of segments disposed within the body and extending from a first port disposed on the first sidewall to a second port disposed on the first sidewall, wherein at least one segment of the plurality of segments extends through the fourth sidewall, wherein a first segment of the plurality of segments is a continuous linear segment that extends from the first port to a first junction, a second segment of the plurality of segments is a continuous linear segment that extends from the first junction to a second junction, a third segment of the plurality of segments extends from the second junction towards the second port, and a last segment of the plurality of segments extends from the second port, and wherein each of the plurality of segments extend only partially through the body.

2. The cooling plate of claim 1, wherein the first port corresponds with an outlet and the second port corresponds with an inlet.

3. The cooling plate of claim 1, wherein at least one of: the channel has a diameter of about 4.0 mm to about 15.0 mm or a distance between the first sidewall and the second sidewall is about 300.0 mm to about 700.0 mm.

4. The cooling plate of claim 1, further comprising a plug disposed in each of the at least one segment that extends through the fourth sidewall to seal the channel.

5. The cooling plate of claim 1, wherein some of the plurality of segments extend parallel to each other in a mounting region, and wherein adjacent segments that extend parallel to each other are configured to flow a coolant in opposite directions.

6. The cooling plate of claim 1, wherein the body comprises aluminum (Al), copper (Cu), or silver (Ag).

7. The cooling plate of claim 1, wherein the plurality of segments have a substantially uniform cross-sectional flow area.

8. The cooling plate of claim 1, wherein the third segment extends from the second junction towards the second port to a third junction, and the plurality of segments further includes a fourth segment extending from the third junction towards the third sidewall to a fourth junction, a fifth segment extending from the fourth junction towards the first sidewall to a fifth junction, a sixth segment extending from the fifth junction towards the fourth sidewall to a sixth junction, and the last segment is a seventh segment extending from the sixth junction directly to the second port.

9. The cooling plate of claim 1, wherein the heat generating microelectronic components include field-effect transistors.

10. A solid state power amplifier, comprising:

a cooling plate having a first side configured to mount a plurality of heat generating microelectronic components and a channel disposed within the cooling plate and extending from an inlet to an outlet, wherein the inlet and the outlet are disposed on a first sidewall of the cooling plate, wherein the channel is configured to circulate a coolant, wherein the cooling plate has a thickness of about 15.0 mm to about 45.0 mm, wherein the channel includes a plurality of segments, wherein at least one segment of the plurality of segments extends through a sidewall orthogonal to the first sidewall, wherein the cooling plate includes a recess proximate the first sidewall that includes cutouts extending entirely through the cooling plate to accommodate components of the solid state power amplifier, and wherein the cooling plate includes a second recess proximate a second sidewall of the cooling plate, and a first guide channel extending from the second sidewall through the second recess to at least one of the plurality of segments.

11. The solid state power amplifier of claim 10, wherein at least one of:

the cooling plate has a width of about 350.0 mm to about 482.0 mm, or the cooling plate has a length of about 300.0 mm to about 700.0 mm.

12. The solid state power amplifier of claim 10, wherein the cooling plate includes a first portion proximate the first sidewall and a second portion, wherein the second portion includes a mounting region having threaded holes configured to mount the plurality of heat generating microelectronic components.

13. The solid state power amplifier of claim 12, wherein the channel includes the plurality of segments comprising a first segment coupled to the inlet, a second segment coupled to the outlet, and a first set of segments that extend parallel to each other between the first segment and the second segment in the second portion corresponding with the mounting region, and wherein adjacent segments of the first set of segments are configured to flow the coolant in opposite directions.

14. A method of cooling a solid state power amplifier, comprising:

drilling sidewalls of a cooling plate to a location disposed within the cooling plate without extending through the cooling plate to create a plurality of segments that define a channel within the cooling plate extending from an inlet to an outlet, wherein the inlet and the outlet are disposed on a first sidewall of the cooling plate and the channel has a substantially uniform cross-sectional area, wherein the cooling plate includes a recess to accommodate components of the solid state power amplifier, wherein the cooling plate has a first side configured to mount a plurality of heat generating microelectronic components, and wherein the channel is configured to circulate a liquid coolant;

drilling a guide channel from the recess to the channel;

plugging the guide channel adjacent the recess to prevent flow of the liquid coolant from the guide channel to the recess; and flowing a liquid coolant from a coolant source through the channel.

15. The method of claim 14, wherein flowing the liquid coolant comprises flowing at least one of water, deionized water, or ethylene glycol $(CH_2OH)_2$.

16. The method of claim 15, wherein the liquid coolant has a temperature of about 5.0 to about 25.0 degrees Celsius.

17. The method of claim 14, wherein drilling the sidewalls of the cooling plate comprises drilling a segment of the plurality of segments from the inlet into the cooling plate, drilling a segment of the plurality of segments from the outlet into the cooling plate, and drilling a segment of the plurality of segments from a sidewall orthogonal to the first sidewall to at least one of the segment from the inlet or the segment from the outlet, wherein drilling the guide channel is performed before drilling from the sidewall orthogonal to the first sidewall, and wherein the segment from the inlet is shorter than the segment from the outlet.

18. The method of claim 14, further comprising plugging the channel at openings on sidewalls of the cooling plate that do not correspond with the inlet or the outlet.

\* \* \* \* \*